United States Patent [19]
Luisi et al.

[11] B 3,982,138
[45] Sept. 21, 1976

[54] HIGH SPEED-LOW COST, CLOCK CONTROLLED CMOS LOGIC IMPLEMENTATION

[75] Inventors: James A. Luisi, Anaheim; Clarence W. Padgett, Fountain Valley; Dana C. Street, Placentia, all of Calif.

[73] Assignee: Rockwell International Corporation, El Segundo, Calif.

[22] Filed: Oct. 9, 1974

[21] Appl. No.: 513,368

[44] Published under the second Trial Voluntary Protest Program on February 3, 1976 as document No. B 513,368.

[52] U.S. Cl. ............................... 307/205; 307/207; 307/215
[51] Int. Cl.² ................. H03K 19/08; H03K 19/36
[58] Field of Search ........... 307/205, 215, 304, 238, 307/246, 251, 207

[56] References Cited
UNITED STATES PATENTS

| | | | |
|---|---|---|---|
| 3,479,523 | 11/1969 | Pleshko | 307/205 |
| 3,521,081 | 7/1970 | Vasseur et al. | 307/205 |
| 3,676,705 | 7/1972 | Meyer | 307/251 |
| 3,683,201 | 8/1972 | Haraszti | 307/205 |
| 3,740,576 | 6/1973 | Haraszti | 307/205 |
| 3,774,055 | 11/1973 | Bapat | 307/251 X |
| 3,825,888 | 7/1974 | Kawagoe | 307/215 X |

OTHER PUBLICATIONS

Boleky et al., "High-Performance Low-Power CMOS Memories Using SOS Technology"; Reprinted from IEEE J. Solid-State Circuits, Vol. SC-7, pp. 135–145, 4/1972: *Semiconductor Memories*, IEEE Press, 1972.
Surgent, "Insulated Gate Field-Effect Transistor Sense Amplifier Latch"; IBM Tech. Discl. Bull.; Vol. 13, No. 9, pp. 2670–2671; 2/1971.
Cole et al., "Logic Gate", IBM Tech. Discl. Bull.; Vol. 16, No. 2, p. 566; 7/1973.
Cole et al., "Dynamic Logic Gate"; IBM Tech. Discl. Bull.; Vol. 16, No. 2, p. 567; 7/1973.

*Primary Examiner*—Stanley D. Miller, Jr.
*Assistant Examiner*—L. N. Anagnos
*Attorney, Agent, or Firm*—H. Fredrick Hamann; G. Donald Weber, Jr.; Morland Charles Fischer

[57] ABSTRACT

A uniquely arranged, clock-controlled integrated circuit is disclosed as a building block for implementing Boolean logic functions. The circuit has a minimum number of components and a design to yield a low cost, high speed operation. The circuit may also include an efficient signal inversion and amplification stage, where such is required.

10 Claims, 2 Drawing Figures

HIGH SPEED-LOW COST, CLOCK CONTROLLED CMOS LOGIC IMPLEMENTATION

BACKGROUND OF THE INVENTION

1. Field of the Invention

This invention relates to clock controlled CMOS circuits for implementing functions of Boolean logic.

2. Description of the Prior Art

Circuits have been known for implementing the functions of Boolean logic which have included numerous diodes and transistor devices connected to a plurality of data nodes. In an attempt to achieve multi-input logic realization and useful power amplification, prior art CMOS circuits have correspondingly required rather complex wiring interconnection networks. The result has been to substantially increase capacitance loading on the data nodes and at the circuit output terminals. This has been found to inherently slow down the operation of the circuit and make logic implementation by the utilization of conventional CMOS devices relatively unfeasible. Moreover, the space consumed by the prior art circuits and the corresponding cost of production thereof has been relatively high.

SUMMARY OF THE INVENTION

Briefly, and in general terms, a unique high speed integrated CMOS circuit is disclosed which may be utilized as a building block for implementing functions of Boolean logic. The circuit includes a precharged data node and an array of transistors connected thereto. The transistors may be connected in series or parallel combinations with respect to one another in order to implement the particular logic function. In the preferred embodiment, the transistors are n-channel metal oxide semiconductor field effect transistors which may be fabricated from conventional silicon on sapphire techniques. An unconditional constant source of current and a periodic source of current are connected to the data node in order to precharge the data node and to compensate for any leakage current through the array of n-channel transistors. This prevents discharge of the data node except when predetermined logic conditions are satisfied. The array of transistors includes means to receive a periodic clock signal in order that the data node may be discharged through an array of transistors only at that period of time which corresponds to the active portion of the circuit operating cycle.

A power amplifier stage is connected between the data node and an output terminal of the instant circuit. The amplifier stage is fabricated to also provide efficient signal inversion and pure power amplification of binary signals to be applied to the circuit output terminal. The inverter may be mechanized so as to minimize the loading at the circuit output terminal and thereby increase the overall speed of operation of the circuit.

DESCRIPTION OF THE PREFERRED EMBODIMENT

Figure 1:
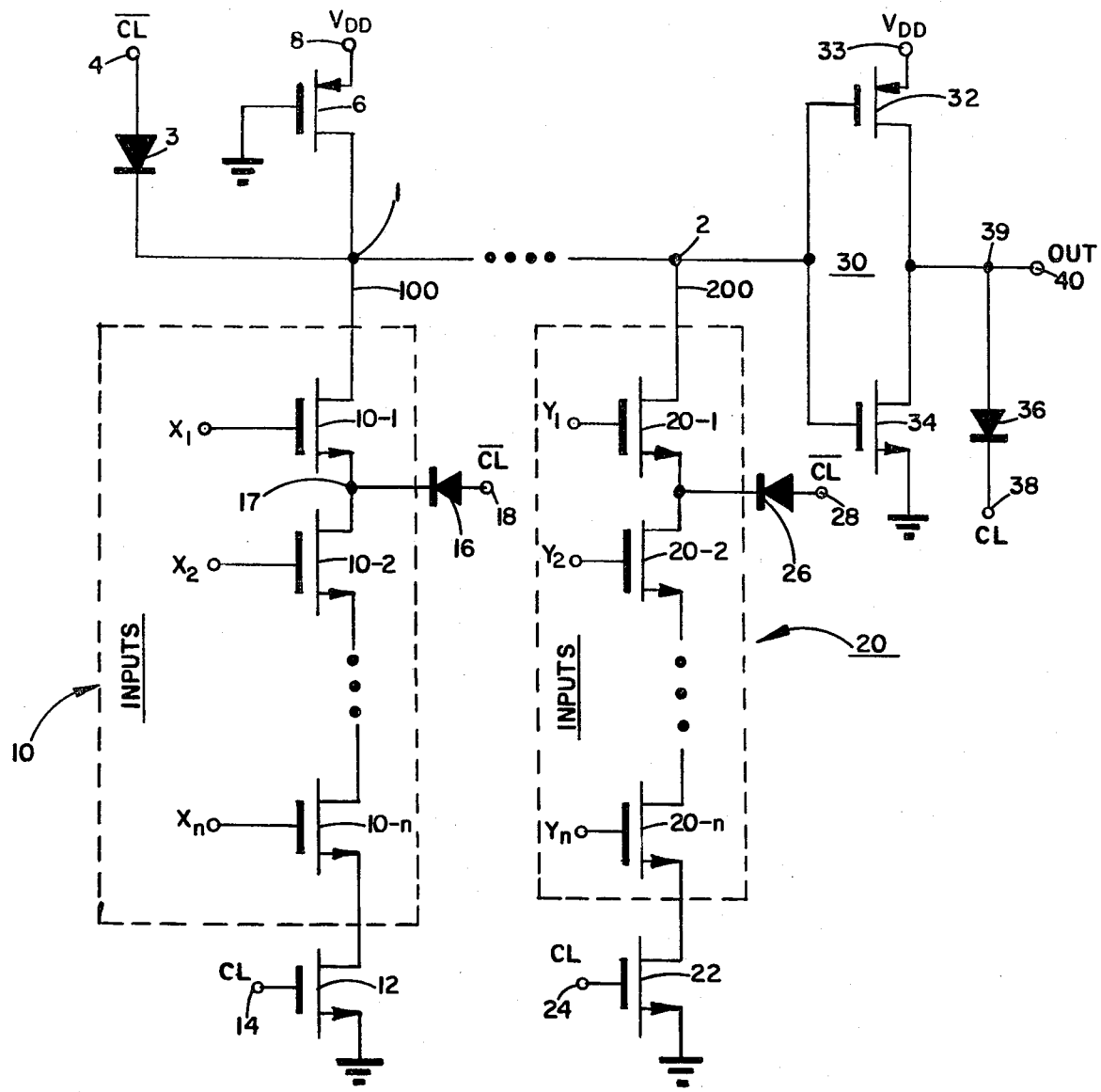
FIG. 1 illustrates an example of a circuit for implementing a function of Boolean logic which employs the teachings of the instant invention.

FIG. 1 of the drawings shows a unique high speed integrated circuit of the instant invention for implementing functions of Boolean logic. The circuit has a data node 1 and an associated conditional discharge line 100. Discharge line 100 includes a transistor stack 10 comprised of a suitable plurality of field effect transistors 10-1 through 10-n. Although, in the instant embodiment, field effect transistors (FETs) 10-1 through 10-n are arranged in series with respect to one another, it is to be understood that the discharge line 100 may include a stack comprised of any convenient combination of transistors connected in series or in parallel combinations depending primarily upon the Boolean function to be realized. In the preferred embodiment, FETs 10-1 through 10-n are conventional n-channel metal oxide semiconductor (MOS) devices which may be fabricated from well known silicon on sapphire techniques. The source and drain electrodes of each of the FETs 10-1 through 10-n form a conduction path for discharge line 100 to enable data node 1 to be conditionally discharged at predetermined intervals of time. A plurality of input signals $X_1$ through $X_n$ are to be applied to the gate electrodes of FETs 10-1 through 10-n respectively. The input signals $X_1$ through $X_n$ are preferably binary in nature. The HI and LOW logic levels of the binary input signals may correspond to the reference voltages of $V_{DD}$ and ground respectively. The $V_{DD}$ voltage may be in a range between 3 to 15 volts dc.

The n-channel FETs 10-1 through 10-n which comprise transistor stack 10 are known to have residual leakage current when rendered nonconductive. To compensate for the leakage current thereof, the source-drain conduction path of a p-channel FET 6 is connected to the transistor stack 10 through data node 1. The source electrode of FET 6 has a terminal 8 thereof which is connected to a supply of voltage $V_{DD}$, as shown. FET 6 is provided with a relatively long channel length to establish a small compensating constant current source. This insures that the line 100 will not be prematurely discharged due to the leakage current of the n-channel FETs 10-1 through 10-n. The current supplied through FET 6 may be set to be greater than the maximum expected leakage current of the transistors comprising stack 10 but less than that which could excessively slow down the conditional discharge of data node 1.

Connected in common at data node 1 with FET 6 is a diode 3. Diode 3 may be a conventional high reverse-breakdown voltage diode fabricated from silicon on sapphire (SOS) techniques to take advantage of the desirable coupling properties obtained thereby (e.g. very small junction capacitance). Diode 3 includes a terminal 4 which is adapted to receive a periodic clock timing signal CL having HI and LOW binary states (e.g. $V_{DD}$ and ground reference potentials) corresponding to the recovery and the active portions of the circuit operating cycle, respectively. The clock signal generally functions as an enabling signal for the logic of the instant invention. The diode 3 will be forward biased during that period of time corresponding to the recovery portion of the operating cycle.

Date node 1 is to be normally precharged to a relatively HI logic level (such as that represented by the voltage $V_{DD}$) when discharge line 100 is inactive. Data node 1 is rapidly precharged or restored to a relatively HI logic level unconditionally by means of the weak leakage compensating current source including FET 6 and periodically by the potential of clock signal CL being applied to terminal 4 during the recovery portion of the operating cycle. Data node 1 may subsequently be discharged through line 100, in the instant embodiment, only when all of the input signals $X_1$ through $X_n$ being applied to the gate electrodes of FETs 10-1 through 10-n respectively are switched to a relatively HI logic level (such as that also represented by the voltage $V_{DD}$). This will connect together in a series circuit the source-drain conduction paths of FETs 10-1 through 10-n to complete discharge line 100.

The source-drain conduction path of a blocking field effect transistor 12 is connected between the FET stack 10 and a source of reference potential (e.g. ground), as shown. The gate electrode of FET 12 includes a terminal 14 thereof which is adapted to receive a periodic clock signal CL thereat. The purpose of FET 12 is to block discharge line 100 until such time as FETs 10-1 through 10-n receive suitable input signals ($X_1$ through $X_n$) applied at the respective gate electrodes thereof to satisfy the predetermined logic conditions. This will cause the FETs comprising stack 10 to be rendered conductive and to complete a discharge path to ground through the respective source-drain connections thereof. This will enable line 100 to be discharged to ground only under the control of those field effect transistors comprising stack 10. The clock signal CL is applied to the terminal 14 of the gate electrode of FET 12 to permit line 100 to be discharged only at that part of the clock signal corresponding to the active portion of the circuit operating cycle. FET 12 is arranged so as to be non-conducting and block line 100 from becoming discharged during that part of the clock signal CL corresponding to the recovery portion of the operating cycle when data nodes (such as that shown at 1), which have been previously discharged, are being precharged back to their original HI logic levels. Thus, in effect, blocking FET 12 will prevent the precharge signal conducted through diode 3 from being applied to discharge line 100 at the same period of time that line 100 is being discharged to ground through the source-drain conduction path of the FET 12.

An an alternative to the employment of a blocking FET 12, a transistor stack (10) may be connected directly to an external source of clock signals CL. Although suitable gating of the signal CL may become necessary, only a single source of clock signals CL will therefore be conveniently required to enable the logic of the instant invention.

Figure 2:
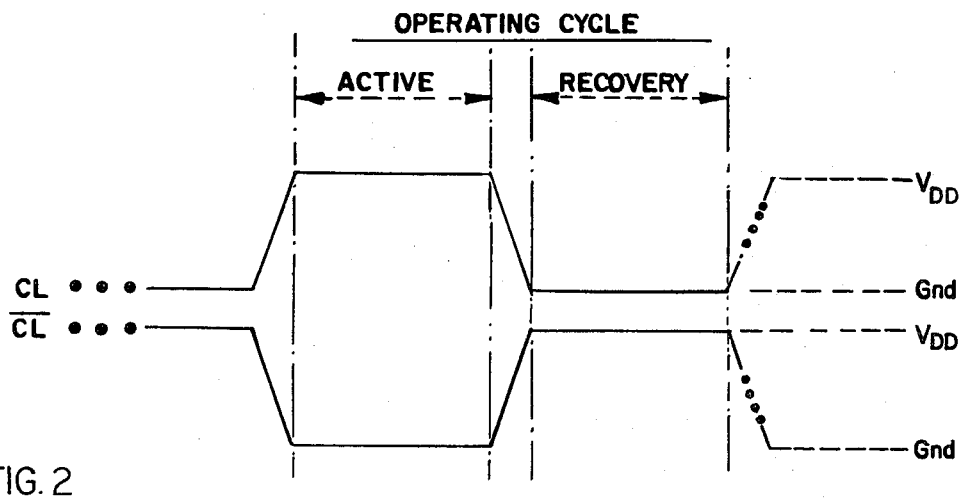
FIG. 2 is a general representation of the clock enabling signals for the instant logic implementing circuit.

FIG. 2 shows a generalized representation of the clock enabling signals CL and CL that have heretofor been described.

A diode 16 may be connected to the FET stack 10 at some convenient point (17) therein. Diode 16 includes a terminal 18 which is adapted to receive the clock signal CL thereat. Diode 16 and the clock signal CL function to pump charge into node 17 and thereby prevent the undesirable momentary transfer of charge from data node 1 into capacitance on node 17 at such time, for instance, when FET 10-1 is being switched on and when path 10 is not logically completed. Other nodes in stack 10 may be similarly precharged with diodes connected to CL.

Having described transistor stack 10, it is to be recognized that any suitable plurality of transistor stacks may be connected at a junction (e.g. 2) common with data node 1. As an example, a second discharge line 200 and an associated transistor stack 20 is illustrated. Although the transistors 20-1 through 20-n which comprise stack 20 have source-drain conduction paths connected in series relative to one another, the instant invention contemplates any other suitable arrangement (e.g. series-parallel) depending upon the Boolean function to be realized. A second set of binary input signals $Y_1$ through $Y_n$ are to be applied to the respective gate electrodes of FETs 20-1 through 20-n.

As previously described with reference to transistor stack 10, transistor stack 20 includes a blocking FET 22 and a clocked diode 26, conveniently connected to discharge line 200, as shown. FET 22 has a source-drain conduction path connected in series between the transistor stack 20 and a source of reference potential (e.g. ground). FET 22 also includes a terminal 24 connected to the gate electrode thereof which is adapted to receive the clock signal CL thereat. FET 22 will unconditionally block discharge line 200 during a period of time and in a manner similar to that disclosed with reference to FET 12 of discharge line 100. Diode 26 includes a terminal 28 thereof which is adapted to receive the clock signal CL thereat. The function of diode 26 and the clock signal CL are similar to that as disclosed with reference to diode 16 of stack 10, and therefore will not be described again.

The logic circuitry of the instant invention includes power amplifier stage 30. Amplifier 30 is comprised of a single p-channel and n-channel pair of unbalanced complementary metal oxide semiconductor (CMOS) transistors 32 and 34, which may be fabricated from conventional silicon on sapphire techniques. FET 32 is a relatively large p-channel device, and FET 34 is a relatively small n-channel device. The source electrode of FET 32 has a terminal 33 thereof which is connected to the source of potential $V_{DD}$. FET 34 has a source electrode thereof connected to a reference source of potential, such as ground. Amplifier 30 has an output terminal 40 connected thereto, as shown. As an example, output terminal 40 may be suitably connected to a succeeding logic stage or to a suitable storage means, such as a bistable flip-flop device (not shown). The relative simplicity by which amplifier 30 may be fabricated and the unbalanced sizes of FETs 32 and 34 help to minimize the capacitance on data node 1. This has the effect of substantially increasing the speed of the logic of the instant invention. By virtue of the circuit design, amplifier 30 may provide relatively pure power amplification as well as efficient signal inversion for a binary signal being applied to the output terminal 40.

In the operation of transistor stack 10, data node 1, which is normally precharged to a relatively HI logic level, will switch to a LOW logic level when it is discharged to ground. As disclosed, with the embodied series connection of FETs 10-1 through 10-n, line 100 can be discharged only when all of the input signals $X_1$ through $X_n$ to the respective gate electrodes of FETs 10-1 through 10-n are at a relatively HI logic level during the active part of the circuit operating cycle. When data node 1 switches to a LOW logic level, FET 32 of the power amplifier-inverter 30 will be made to turn on by the voltage $V_{DD}$ being supplied to terminal 33. This causes output terminal 40 to have a relatively HI binary level signal impressed thereon. On the other hand, if one or more of the inputs $X_1$ through $X_n$ were at a relatively low logic level and the predetermined logic conditions were not satisfied, node 1 cannot be discharged during that period of time corresponding to the active part of the operating cycle. Consequently, FET 32 will not be turned on while FET 34 will remain on. The output terminal 40 will therefore be connected to ground through the source-drain connection of FET 34, and a relatively LOW level signal will be impressed thereon.

The logic which has been implemented by the circuitry of FIG. 1 represents an array of multi-input NAND gates (e.g. 10 and 20). However, this is for the purpose of illustration only, and it is to be understood that any other logic function may be suitably realized by practicing the instant invention. Thus, the techniques of the instant invention may be utilized to interconnect several circuits as logic building blocks to implement complex Boolean functions. For example, the instant circuit arrangement may be utilized to implement general purpose logic (such as for the operation decoding of a central processing unit fabricated on a semiconductor-type chip).

Still another application of the instant invention may be to mechanize other forms of high speed decoder networks. The need for low cost and easily fabricated high speed, multi-input NAND gates which include efficient stages of signal inversion and power amplification in memory address decoder networks has been an important factor in designing such devices as large scale integration read only memories (ROM) and random access memories (RAM). The circuit configuration of the instant invention can provide the necessary logic for the aforementioned devices while having very fast transients and requiring negligible standby power. Moreover, the utilization of conventional CMOS transistors with minimum inter-connections therebetween can be efficiently realized. If a decoder circuit were to be implemented in accordance with the teachings of the instant invention, a stack of transistor switches 10 can be made so that the channel widths of the transistor switches vary progressively. For example, FET 10-1 can have a width one half the width of FET 10-2, which can have a width one half that of FET 10-3, etc. FET 10-1, which may in the instant embodiment, be chosen to have a channel width in the order of 2.0 mils, can have the narrowest width within the transistor stack 10 and is sized to achieve the desired decoder speed.

A diode 36 may be connected at a junction 39 between the output terminal 40 and power amplifier 30. Diode 36 includes a terminal connected to the cathode thereof which is adapted to receive a clock signal CL thereat. The diode 36 helps output terminal 40 recover to a LOW logic level. Clock signal CL is applied to diode terminal 38 when it is desired to quickly erase a prior signal from output terminal 40. The binary signal which has been impressed on output terminal 40 during the active part of the circuit operating cycle can be conducted through the forward biased diode 36 and subsequently clamped to ground during that period of time corresponding to the recovery portion of the operating cycle, when data node 1 is being precharged. It is to be understood that this function could also be accomplished by a suitable n-channel FET (not shown) connected between junction 39 and ground and activated by a CL signal.

It will be apparent that while a preferred embodiment of the invention has been shown and described, various modifications and changes may be made without departing from the true spirit and scope of the invention. For example, while the FETs 10-1 through 10-n have been disclosed as n-channel devices, it is to be understood that suitable p-channel devices may be substituted therefor. Such p-channel devices would have electrode terminals thereof adapted to be connected to respective potential supplies of appropriate magnitude and polarity.

Having thus set forth a preferred embodiment of the invention, what is claimed is:

1. A synchronous circuit for implementing functions of logic having an operating cycle comprising an active and a recovery segment and including,
    source means for supplying a plurality of reference potentials,
    a data node adapted to be charged to a first of said reference potentials or to be discharged to a second of said reference potentials,
    a data output terminal to receive a signal thereat representative of the reference potential of said data node,
    at least one semiconductor device connected between said data node and said reference potential source means,
    current source means connected to said data node to charge said data node to said first reference potential, and
    timing signal means connected to said at least one semiconductor device to enable said data node to be discharged through a conduction path of said at least one semiconductor device and to said second reference potential during the active segment of the circuit operating cycle,
    said current source means including a source of constant current and a source of periodic current to charge said data node to said first reference potential,
    said source of constant current connected to said reference potential source means to charge said data node to said first reference potential during the recovery segment of the circuit operating cycle to thereby compensate for residual leakage current from said at least one semiconductor device, and
    said source of periodic current connected to said timing signal means to periodically charge said data node to said first reference potential during the recovery segment of the circuit operating cycle.

2. The circuit of claim 1, wherein said at least one semiconductor device is a metal oxide, n-channel field effect transistor.

3. The circuit of claim 2 wherein said field effect transistor is fabricated from a layer of silicon on sapphire.

4. The circuit of claim 1 wherein said source of constant current includes a field effect transistor having source, gate, and drain electrodes,
    the source electrode thereof connected to said reference potential source means to drive said field effect transistor and the drain electrode thereof connected to said data node.

5. The circuit of claim 1 wherein said source of periodic current has a diode means connected thereto so that current is supplied through said diode and to said data node during the recovery segment of said operating cycle.

6. The circuit of claim 5, wherein said diode means is fabricated from a layer of silicon on sapphire.

7. The circuit of claim 1 including inverter means connected between said data node and said output terminal.

8. The circuit of claim 7, wherein said inverter means is comprised of a first n-channel field effect transistor and a second p-channel field effect transistor,
   the channel width of said first field effect transistor being narrower relative to the corresponding channel width of said second field effect transistor.

9. The circuit of claim 1, wherein the signal received at said data output terminal is periodically clamped to said second reference potential through a unidirectional current conducting means during the recovery segment of said circuit operating cycle.

10. In combination:
   source means for supplying a plurality of reference potentials,
   a data node adapted to be selectively charged to a first of said reference potentials and discharged to a second of said reference potentials,
   current source means connected to said data node and adapted to selectively charge said data node to a first of said reference potentials,
   said current source means including a source of constant current and a source of periodic current,
   said source of constant current connected to said reference potential source means to charge said data node to said first reference potential,
   said source of periodic current having terminal means to receive a clocking signal thereat so as to periodically charge said data node to said first reference potential, and
   circuit means having a conduction path thereof connected between said data node and said reference potential source means and adapted to selectively discharge said data node through said conduction path and to the second of said reference potentials.

* * * * *